(12) United States Patent
Allin et al.

(10) Patent No.: US 6,552,675 B1
(45) Date of Patent: Apr. 22, 2003

(54) ELECTRICAL PROTECTION DEVICE WITH ANALOG-TO-DIGITAL CONVERTER OF THE SIGMA-DELTA TYPE

(75) Inventors: Patrice Allin, Meylan (FR); Jean-Paul Barjonnet, Montbonnot Saint Martin (FR); Eric Suptitz, Montaud (FR)

(73) Assignee: Square D Company, Palatine, IL (US)

( * ) Notice: Subject to any disclaimer, the term of this patent is extended or adjusted under 35 U.S.C. 154(b) by 286 days.

(21) Appl. No.: 09/644,053

(22) Filed: Aug. 23, 2000

(51) Int. Cl.$^7$ ................................................ H03M 3/00
(52) U.S. Cl. ...................... 341/143; 361/96; 708/313; 341/155
(58) Field of Search ................... 341/143, 141, 341/155, 156, 142; 708/313; 361/96

(56) References Cited

U.S. PATENT DOCUMENTS 4,943,888 A * 7/1990 Jacob et al. ................ 361/96
5,448,747 A * 9/1995 Garverick et al. .......... 395/800
5,627,536 A   5/1997 Ramirez ..................... 341/141
6,317,765 B1 * 11/2001 Page et al. .................. 708/313

* cited by examiner

Primary Examiner—Brian Young
Assistant Examiner—John Nguyen
(74) Attorney, Agent, or Firm—Parkhurst & Wendel, L.L.P.

(57) ABSTRACT

The electrical protection device comprises a plurality of sensors, a multiplexer and a sigma-delta type analog-to-digital converter. The converter comprises a sigma-delta modulator in series with a numerical decimation filter. The decimation filter comprises weighting coefficients $k_i$, of level 1 to n, such that the product of the measuring range of the signals measured by the sensors and of the ratio $$\sum_1^m k_i / \sum_1^n k_i$$

is less than the precision required for said signals, the coefficients of level 1 to m being the coefficients used during the stabilization time of the modulator. The coefficients of the filter of level 1 to m are preferably zero.

8 Claims, 5 Drawing Sheets

ELECTRICAL PROTECTION DEVICE WITH ANALOG-TO-DIGITAL CONVERTER OF THE SIGMA-DELTA TYPE

BACKGROUND OF THE INVENTION

The invention relates to an electrical protection device comprising a plurality of sensors, a multiplexer connected to the output of the sensors to receive a plurality of electrical signals to be measured with a predetermined precision, an analog-to-digital converter, connected to the output of the multiplexer, and digital processing means connected to the analog-to-digital converter.

It is standard usage, in electrical protection devices, and more particularly in an electronic trip device of an electrical circuit breaker, to multiplex the currents and/or voltages of an electrical power system to be protected, and then to perform an analog-to-digital conversion before processing them in a digital processing circuit, preferably microprocessor-based (U.S. Pat. Nos. 5,101,316, 4,672, 501).

It has moreover been proposed to use sigma-delta type analog-to-digital converters in an electronic trip device. In this case, the trip device comprises a converter associated to each measuring channel, i.e. to each current sensor. In the document U.S. Pat. No. 4,943,888, three sigma-delta converters are required. In the case of a top-of-the-range trip device there may be up to 8 measuring channels, one for the currents of the three phases, one for the neutral current, three for the voltages of the three phases and one for the ground fault current, which would mean using 8 converters.

The use of a multiplexer in combination with a sigma-delta type analog-to-digital converter has not been envisaged up to now in a protection device due to the problems arising from the transient signals able to be created by a sudden front when switching from one measuring channel to the next.

SUMMARY OF THE INVENTION

The object of the invention is to improve the measuring precision of an electrical protection device, more particularly of an electronic trip device, with a reduced cost and volume.

According to the invention, this object is achieved by the fact that the analog-to-digital converter is of the sigma-delta type, comprising a sigma-delta modulator, having a preset stabilization time, connected in series with a numerical decimation filter, the decimation filter comprising a plurality of weighting coefficients of level 1 to n, such that, a first quantity corresponding to the ratio between the sum of the coefficients of the decimation filter, of level 1 to m, used during the modulator stabilization time, and the sum of all the coefficients of the filter, a second quantity corresponding to the ratio between the maximum and minimum amplitudes of the electrical signals to be measured, the product of the first and second quantities is lower than said precision, m being much lower than n.

Combining a multiplexer and a sigma-delta type converter, made possible by a suitable choice of the decimation filter coefficients, enables the high resolution and excellent linearity of the sigma-delta converter to be combined with the space and cost saving resulting from the use of a multiplexer and a single analog-to-digital converter.

BRIEF DESCRIPTION OF THE DRAWINGS

Other advantages and features will become more clearly apparent from the following description of particular embodiments of the invention, given as non-restrictive examples only and represented in the accompanying drawings in which.

DETAILED DESCRIPTION OF PREFERRED EMBODIMENTS

Figure 1:
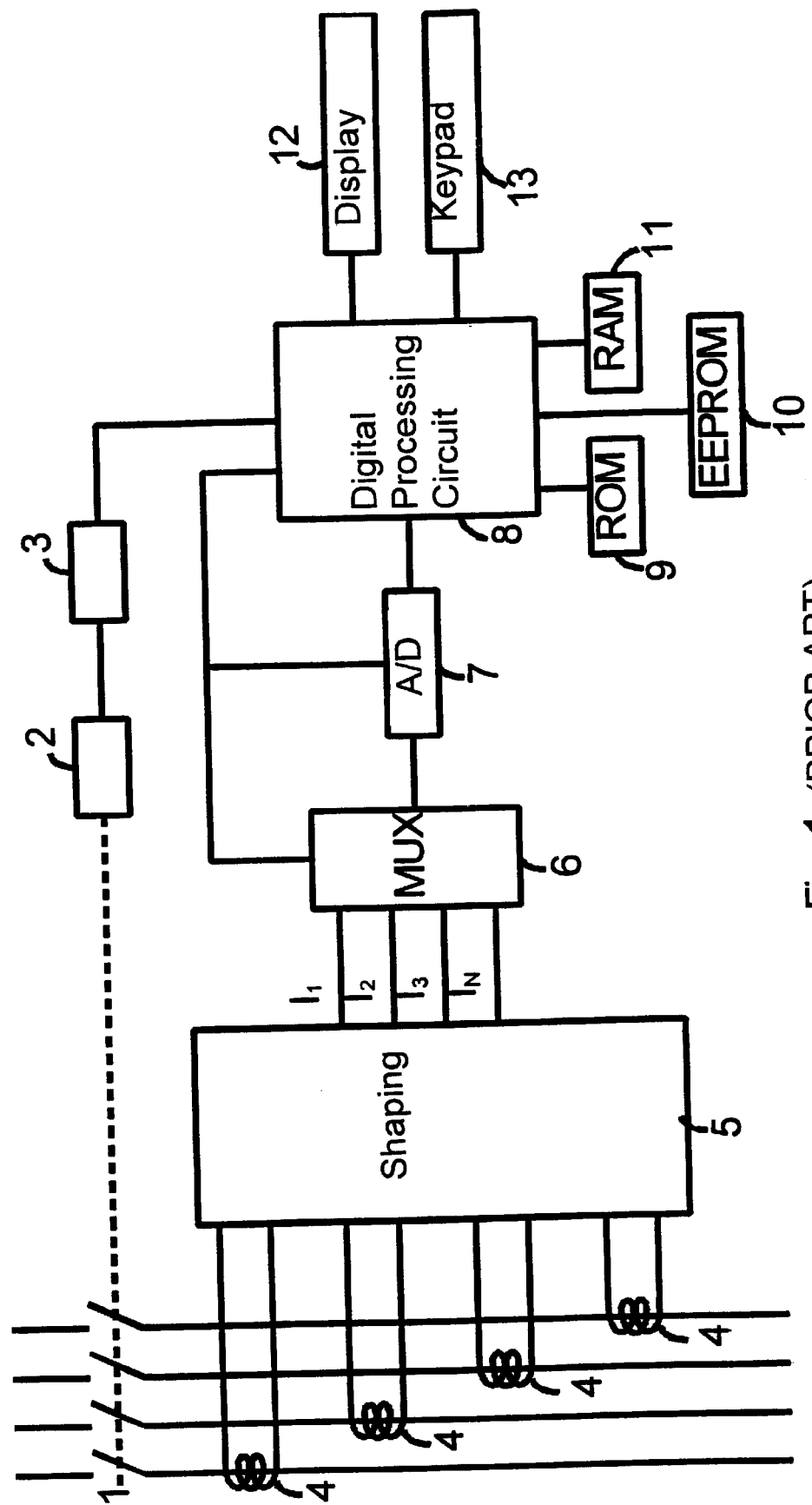
FIG. 1 represents, in block diagram form, an electronic trip device according to the prior art.

In FIG. 1, an electrical power distribution system supplying a load (not represented) comprises a circuit breaker 1 designed to interrupt the circuit in the open position. The mechanism 2 of the circuit breaker 1 is controlled by a polarized control relay 3 ordering tripping of the circuit breaker in the event of an overload or a short-circuit. Each conductor has associated thereto a current transformer 4, which delivers an analog signal representative of the current flowing in the associated conductor. This signal is applied to a shaping circuit 5 whose outputs $I_1, I_2, I_3, I_N$, are applied via a multiplexer 6 to an analog-to-digital converter 7. The output of the converter 7 is connected to a digital processing circuit 8, which circuit in addition controls the multiplexer and converter. The circuit 8 is connected to various auxiliaries necessary for its operation, and in particular to a read-only memory (ROM) 9, a random access memory (RAM) 11, a non-volatile memory (EEPROM) 10, a keypad 13 and a display 12. An electrical protection device of this type is conventional and described, in particular, in the document U.S. Pat. No. 5,101,316.

Figure 2:
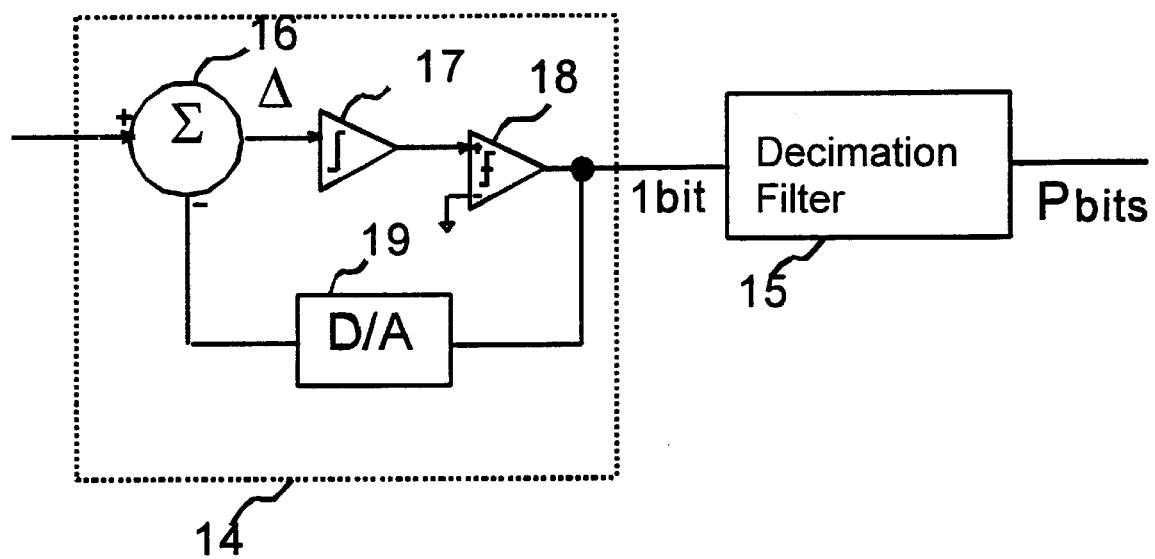
FIG. 2 illustrates an analog-to-digital converter of sigma-delta type according to the prior art.

According to the invention the analog-to-digital converter 7 is of the sigma-delta type. Such a converter, of known type, illustrated in FIG. 2, comprises in series a sigma-delta modulator 14 and a decimation filter 15. The sigma-delta modulator 14 converts the analog signals applied to its input into an uninterrupted flow of bits, 1 or 0, at a preset frequency, about 1 MHz in a preferred embodiment. The modulator 14 comprises, in series, a differential summing circuit 16 supplying signals Δ, an integrator 17, and an analog comparator 18. A 1-bit digital-to-analog converter 19 is connected in a feedback loop between the output of the modulator 14 and a negative input of the differential summing circuit 16. The decimation filter 15 converts the bits output from the modulator 14 into data encoded on P bits, at a sampling frequency $F_e$. For this, each output sample X from the decimation filter is obtained by summing n successive 1-bit samples $x_i$, supplied by the modulator 14, weighted by n associated weighting coefficients $k_i$ of the filter:

$$X = \sum_{1}^{n} k_i x_i$$

with i=1 to n

A converter of this kind presents a high resolution and an excellent linearity and does not require any adjusting. However, if such a converter is used downline from a multiplexer, the fronts generated by the multiplexer on each change of measuring channel are rich in high frequency components, which modifies the spectral content of each sampled signal and makes its analysis unusable.

Figure 3:
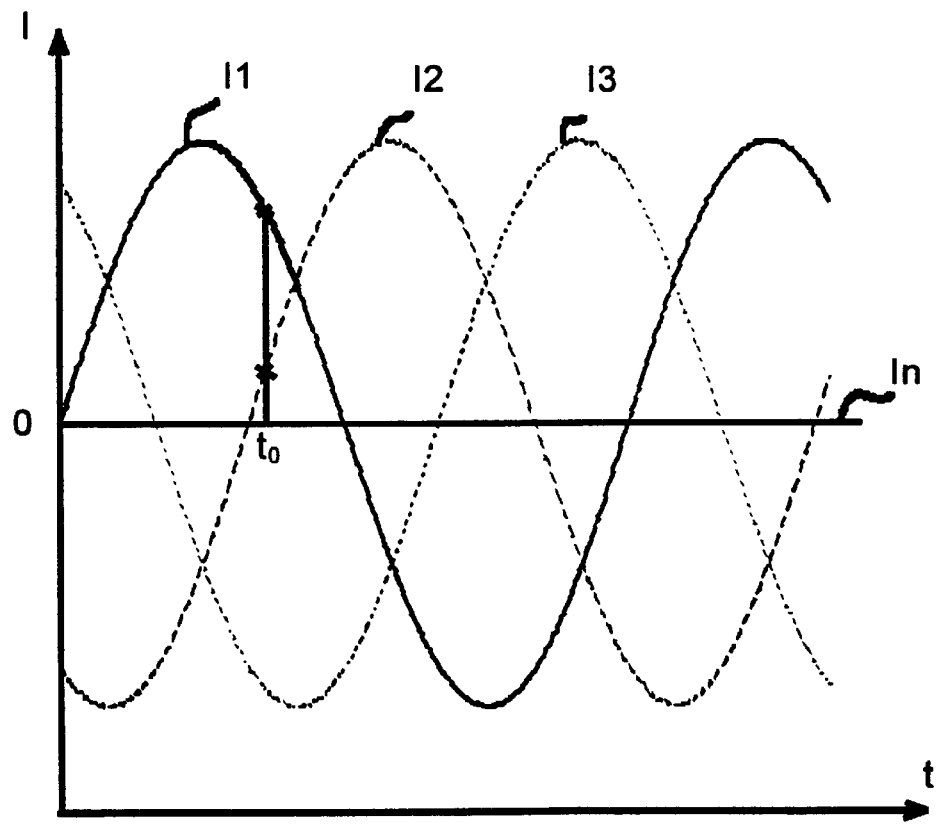
FIGS. 3 and 4 illustrate the variations caused when switching from one measuring channel to the next in a device according to the invention.
Figure 4:
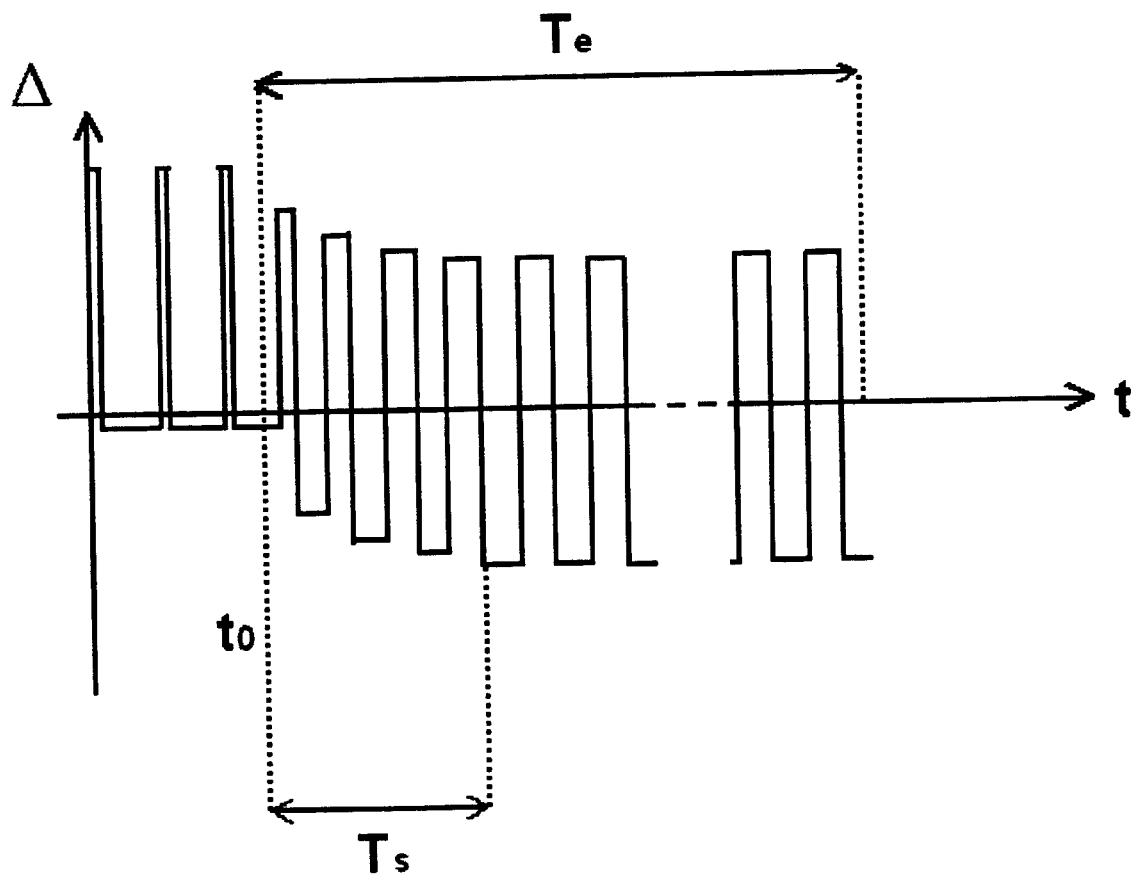

FIGS. 3 and 4 illustrate the problems set by multiplexing several measuring channels in an electrical protection device. In FIG. 3, the sinusoidal currents with a phase difference of 120° of three phases $I_1$, $I_2$ (in fine broken lines) and $I_3$ (in heavy broken line) of a three-phase electrical power system, and the neutral current $I_N$ which is normally zero, are represented versus time. It is apparent from FIG. 3 that at a given time $t_0$, if the multiplexer which was transmitting the signals $I_1$ to the analog-to-digital converter switches onto the next measuring channel, i.e. measurement of $I_2$, the amplitude difference may be great.

This sudden variation at the switching time $t_0$ of the multiplexer causes non significant transient signals to occur at the input of the decimation filter during a stabilization time $T_s$ of the modulator. The input signals Δ of the integrator 17 of the modulator in fact only stabilize after the time $T_s$ (FIG. 4). The decimation filter taking these signals into account between the times $t_0$ and $t_0+T_s$ falsifies measurement of the sample measured between the times $t_0$ and $t_0+T_e$, $T_e$ being the decimation filter sampling period.

For example purposes, in the case of a decimation filter supplying samples encoded on 11 bits (P=11), the maximal difference between the amplitudes of the signals to be measured corresponds to a ratio of 4096 (11 bits at 1 as compared with 1 bit at 1). It can be shown that, if the 1st sample $x_1$ has the highest value corresponding to the value of the last sample $x_n$ of the previous measuring channel, all the following samples of the measuring channel involved being at the value 1 representative of the sample to be measured, the error generated is 13% if the decimation filter coefficients form a sine i/i type curve, with n=128. Under the same conditions, if the first two samples $x_1$ and $x_2$ are wrong and equal to the previous value of $x_n$, the error increases up to 50%. If the coefficients of the decimation filter form a triangle, i.e. if $k_1=k_n=1$, $k_2=k_{n-1}=2$, $k_3=k_{n-3}=3$, the error is even greater, the weight of the first samples $x_1$, $x_2$, being greater. In this case errors of around 133% can be reached for a single wrong bit and of around 399% for 2 wrong bits.

In a more general manner, if the protection device is considered to have a range of 200, i.e. it must be able to measure currents ranging from 0, 1 $I_n$ to 20, $I_n$ being the rated current of the device, the error goes from 0.6% for one wrong bit to 2.4% for 2 wrong bits and to 72% for 8 wrong bits in the case of a sine (i)/i curve. Under the same conditions, with a distribution of the weighting coefficients of the filter in a triangle, the error goes from 6% for one wrong bit to 19% for 2 wrong bits and to 232% for 8 wrong bits.

The above examples clearly show the problem set by multiplexing signals up-line from a sigma-delta type analog-to-digital converter.

Let there be a first quantity $G_1$ equal to the ratio between the sum $$\sum_1^m k_i$$

of the coefficients of the decimation filter, of level 1 to m, used during the modulator stabilization time $T_s$ and the sum $$\sum_1^n k_i$$

of all the coefficients of the filter. Let there be a second quantity $G_2$ equal to the ratio between the maximum and minimum amplitudes of the electrical signals to be measured, i.e. representative of the measuring range.

According to the invention, as shown in FIG. 9, the weighting coefficients $k_1$ of the filter 20 must be such that the product $G_1*G_2$ is less than the precision required by measurement of the electrical signals.

Figure 5:
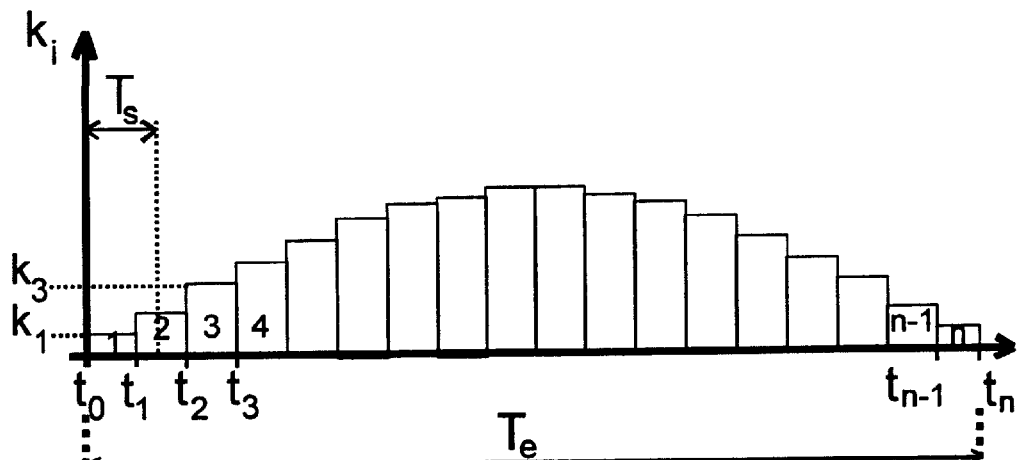
FIGS. 5 to 8 represent, in schematic form, alternative embodiments of the values of the weighting coefficients of the decimation filter of a device according to the invention.
Figure 6:
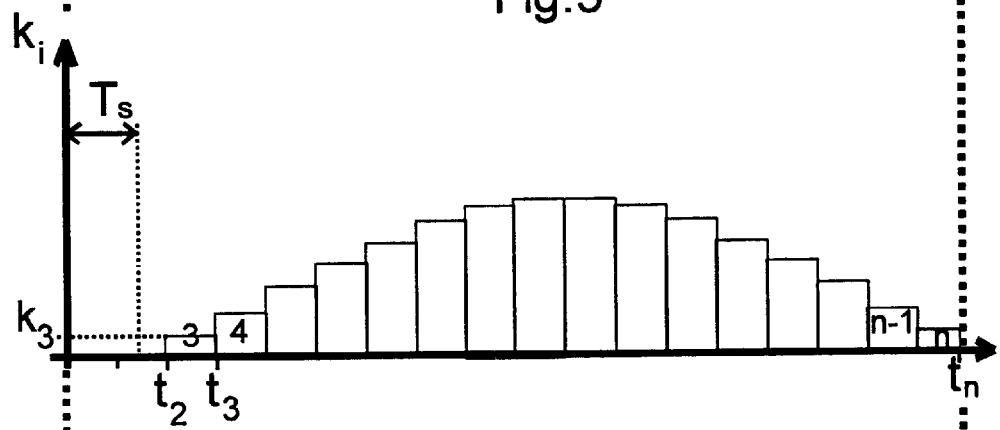
Figure 7:
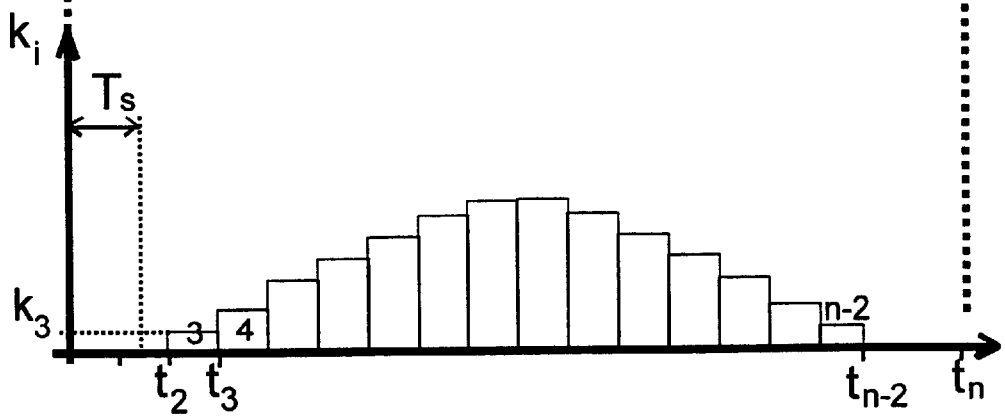

In FIGS. 5 to 7, the modulator stabilization time $T_s$ is less than the time $(t_0-t_2)$ of 2 output bits of the sigma-delta modulator. In this case m=2. The coefficients $k_1$ and $k_2$, of level 1 to m, therefore simply have to be chosen so that the condition: $G_1*G_2$<precision is fulfilled. The number n of coefficients represented in FIGS. 5 to 7 has been limited for the sake of clarity. In a preferred embodiment, represented in FIG. 8, n=128 and m=8. The number m is always much lower than n, the modulator stabilization time $T_s$ being much lower than $T_e$.

The coefficients of the filter preferably form a sine (i)/i curve, as represented in FIGS. 5 to 7 and in FIG. 9 in a broken line. In a preferred embodiment, represented in FIG. 8, this curve is modified in its central part, the coefficients of the filter being limited to a preset value, 511 in the figure. This enables the size of a memory, for example of ROM type, containing the coefficients to be limited to a 9-bit ROM.

In conventional manner, the weighting coefficients of the decimation filter are preferably symmetrical: $k_1=k_n$, $k_2=k_{n-1}$, $k_3=k_{n-3}$ ... (FIGS. 5 and 7), which enables a better noise rejection.

FIGS. 6 and 7 differ from FIG. 5 by the fact that the first two coefficients, $k_1$ and $k_2$, used during the modulator stabilization time $T_s$ are zero. In both cases, the quantity $G_1$ is then zero and the product $G_1*G_2$ zero, thus automatically fulfilling the condition "$G_1*G_2$ less than the precision". In FIG. 7, the coefficients of the filter are symmetrical, whereas in FIG. 6 only the non-zero coefficients are symmetrical. Thus, in FIG. 6: $k_3=k_n$, $k_4=k_{n-1}$, ..., whereas in FIG. 7: $k_3=k_{n-2}$, $k_4=k_{n-3}$, ...

Figure 8:
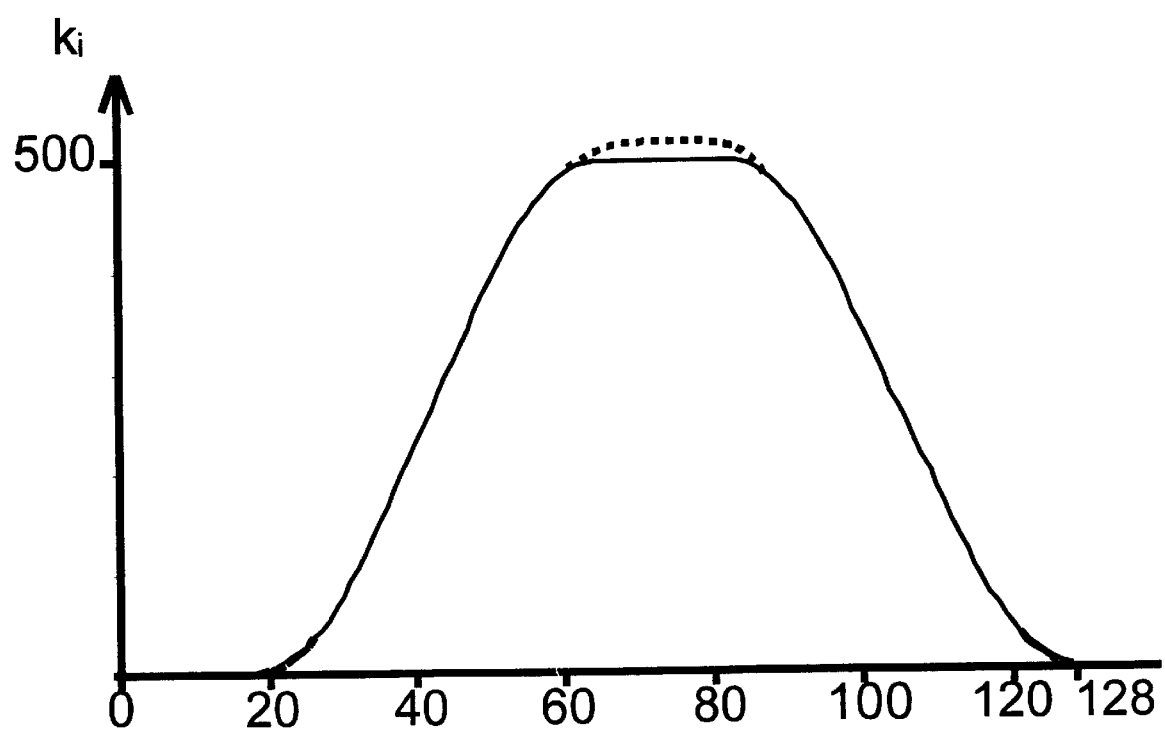

In a preferred embodiment, the multiplexer is a 4-channel multiplexer, the output frequency of the sigma-delta modulator is 1 MHz, the filter comprises 128 coefficients (n=128), forming a sine i/i curve, limited to the value 511, the first 18 coefficients $k_1$ to $k_{18}$ being zero and the non-zero coefficients of the filter being symmetrical (FIG. 8).

For an output frequency of the modulator of 1 MHz, if the modulator stabilization time $T_s$ is about 8 μs, m=8, zero resetting of the first 8 coefficients of the filter enables the condition set out above to be fulfilled in all cases.

Weighting of the first m bits of a sample by the coefficient zero thus enables the error due to multiplexing to be eliminated.

The invention enables the number of converters used to be reduced, which reduces the cost of the electronics. It also enables space to be saved if the conversion function is integrated in an ASIC, and enables the current consumed by the electronic circuitry to be reduced. The latter feature consequently enables the load of the elements performing power supply of the electronic circuitry to be lightened and/or the size or thermal resistance thereof to be reduced.

In the case of an electronic trip device, the sensors are current sensors. A top-of-the-range trip device, also performing voltage and possibly power measurements, may also comprise voltage sensors. In a particular embodiment, such a trip device comprises two multiplexers, with 4 channels each, one of these multiplexers being associated to the current sensors ($I_1$, $I_2$, $I_3$, $I_N$) and the other to the voltage sensors ($U_1$, $U_2$, $U_3$) and to a ground fault current sensor ($I_G$). Each multiplexer is connected in series to a 15-bit sigma-delta type analog-to-digital converter, integrated in an ASIC. The decimation filter can be included in the digital processing circuit, also integrated in the ASIC. The use of two converters enables simultaneous acquisition and conversion of the currents and voltages, which eliminates errors due to the voltage-current phase difference for computation of the power.

The invention is not limited to the particular embodiments represented in the figures and described above. It applies to any electrical protection device comprising at least two multiplexed measuring channels using a single sigma-delta type analog-to-digital converter.

What is claimed is:

1. An electrical protection device comprising a plurality of sensors, a multiplexer connected to the output of the sensors to receive a plurality of electrical signals to be measured with a predetermined precision, an analog-to-digital converter, connected to the output of the multiplexer, and digital processing means connected to the analog-to-digital converter, wherein the analog-to-digital converter is a sigma-delta analog-to-digital converter comprising a sigma-delta modulator, having a preset stabilization time, connected in series with a numerical decimation filter, the decimation filter comprising a plurality of all weighting coefficients level 1 to n, such that, a first quantity corresponding to a ratio between a first sum of the coefficients, of level 1 to m, used during the modulator preset stabilization time, and a second sum of all the coefficients of level 1 to n of the filter, a second quantity corresponding to a ratio between the maximum and minimum amplitudes of the electrical signals to be measured, the product of the first and second quantities is being lower than said precision, m being much lower than n.

2. The device according to claim 1, wherein the coefficients of the filter of level 1 to m are zero.

3. The device according to claim 2, wherein the non-zero coefficients of the filter are symmetrical.

4. The device according to claim 1, wherein the coefficients of the filter are symmetrical.

5. The device according to claim 1, wherein the coefficients of the filter form a sine (i)/i type curve.

6. The device according to claim 5, wherein the coefficients of the filter are limited to a preset value.

7. The device according to claim 1, wherein the sensors are current sensors, the device being a trip device.

8. The device according to claim 1, wherein the digital processing means comprise the decimation filter.

* * * * *